(12) United States Patent
Yao et al.

(10) Patent No.: US 12,218,091 B2
(45) Date of Patent: Feb. 4, 2025

(54) SUPERCONDUCTING BUMP BONDS FOR QUANTUM COMPUTING SYSTEMS

(71) Applicant: Google LLC, Mountain View, CA (US)

(72) Inventors: Zhimin Jamie Yao, Santa Barbara, CA (US); Bob Benjamin Buckley, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/177,876

(22) Filed: Mar. 3, 2023

(65) Prior Publication Data

US 2023/0207507 A1 Jun. 29, 2023

Related U.S. Application Data

(62) Division of application No. 17/163,232, filed on Jan. 29, 2021, now Pat. No. 11,600,588.

(51) Int. Cl.
*H01L 23/00* (2006.01)
*G06N 10/00* (2022.01)
*H01L 25/16* (2023.01)

(52) U.S. Cl.
CPC .......... *H01L 24/13* (2013.01); *G06N 10/00* (2019.01); *H01L 24/81* (2013.01); *H01L 25/16* (2013.01); *H01L 2224/13105* (2013.01); *H01L 2224/13109* (2013.01); *H01L 2224/13111* (2013.01); *H01L 2224/13113* (2013.01); *H01L 2224/13116* (2013.01); *H01L 2224/13117* (2013.01); *H01L 2224/1312* (2013.01); *H01L 2224/13139* (2013.01); *H01L 2224/13144* (2013.01); *H01L 2224/13147* (2013.01);

(Continued)

(58) Field of Classification Search
CPC ......... H01L 24/13; H01L 24/81; H01L 25/16; H01L 2224/13111; H01L 2224/1357; H01L 2224/8112; H01L 2224/81203; H01L 2924/0105; H01L 24/05; H01L 24/08; H01L 24/11; H01L 24/80; G06N 10/00; G06N 10/40
See application file for complete search history.

(56) References Cited

U.S. PATENT DOCUMENTS 10,497,853 B2 * 12/2019 Mutus ..................... H01L 24/16
2002/0090756 A1 * 7/2002 Tago ......................... H01L 24/81
257/E21.511

(Continued)

OTHER PUBLICATIONS

Bruzzone et al., "Electrical Properties of Low Melting Point Alloys at 4.2K", Cryogenics, Aug. 1987, vol. 27, Issue 8, pp. 433-436.

(Continued)

*Primary Examiner* — Douglas W Owens
(74) *Attorney, Agent, or Firm* — DORITY & MANNING P.A.

(57) ABSTRACT

A quantum computing system can include a first substrate including one or more quantum control devices. The quantum computing system can include a second substrate including one or more quantum circuit elements. The quantum computing system can include one or more tin contact bonds formed on the first substrate and the second substrate. The tin contact bonds can bond the first substrate to the second substrate. The tin contact bonds can be or can include tin, such as a tin alloy.

16 Claims, 11 Drawing Sheets

(52) U.S. Cl.
CPC ............... *H01L 2224/13179* (2013.01); *H01L 2224/1357* (2013.01); *H01L 2224/13666* (2013.01); *H01L 2224/8112* (2013.01); *H01L 2224/81203* (2013.01); *H01L 2924/01029* (2013.01); *H01L 2924/01031* (2013.01); *H01L 2924/01041* (2013.01); *H01L 2924/01047* (2013.01); *H01L 2924/01048* (2013.01); *H01L 2924/01049* (2013.01); *H01L 2924/0105* (2013.01); *H01L 2924/01051* (2013.01); *H01L 2924/01079* (2013.01); *H01L 2924/01082* (2013.01); *H01L 2924/01083* (2013.01); *H01L 2924/04941* (2013.01)

(56) References Cited

U.S. PATENT DOCUMENTS

2005/0266670 A1* 12/2005 Lin ........................ H01L 24/94
257/E21.705
2006/0131731 A1* 6/2006 Sato ........................ H03H 9/105
257/710
2020/0006621 A1 1/2020 Mutus et al.

OTHER PUBLICATIONS

Gygax et al., "Four Critical Fields in Superconducting Indium Lead Alloys", Physical Letters, Feb. 15, 1954, vol. 8, 3 pages.

Livingston, "Magnetic Properties of Superconducting Lead-Base Alloys", Physical Review Journal, Mar. 1, 1963, vol. 129, Issue 5, 7 pages.

Livingston et al., "The Effect of Metallurgical Variables on Super conducting Properties", Progress in Materials Science, 1963-1965, vol. 12, pp. 185-284.

Liu et al., "Superconducting Phase Diagram and Nontrivial Band Topology of Structurally Modulated Sn1-xSbx", Physical Review Materials, Aug. 19, 2019, vol. 3, Issue 8, 8 pages.

Love, "Superconductivity in Tin-Bismuth and Tin-Antimony Alloys", Physical Review Journal, Oct. 15, 1953, vol. 92, Issue 2, 6 pages.

Matsumoto et al., "Superconducting Joints Using Bi-Added PbSn Solders", Applied Physics Express, Aug. 30, 2017, vol. 10, No. 9, 5 pages.

* cited by examiner

SUPERCONDUCTING BUMP BONDS FOR QUANTUM COMPUTING SYSTEMS

PRIORITY CLAIM

The present application is a division of U.S. application Ser. No. 17/163,232 having a filing date of Jan. 29, 2021. Applicant claims priority to and the benefit of each of such applications and incorporate all such applications herein by reference in its entirety.

FIELD

The present disclosure relates generally to superconducting bump bonds having improved fabrication process tolerance, and, more particularly, to superconducting bump bonds incorporating tin and/or tin alloy for quantum computing applications.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a|0⟩ +b|1⟩ The "0" and "1" states of a digital computer are analogous to the |0⟩ and |1⟩ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a quantum computing system. The quantum computing system can include a first substrate including one or more quantum control devices. The quantum computing system can include a second substrate including one or more quantum circuit elements. The quantum computing system can include one or more tin contact bonds formed on the first substrate and the second substrate.

Another example aspect of the present disclosure is directed to a method for bonding substrates. The method can include depositing, on a first substrate, one or more tin bond deposits, the one or more tin bond deposits including tin. The method can include heating the first substrate to a tin contact bond formation temperature. The method can include pressing the first substrate against a second substrate to form one or more tin contact bonds from the one or more tin bond deposits.

Another example aspect of the present disclosure is directed to a method of bonding substrates. The method can include depositing, on a first substrate, one or more tin bond deposits, the one or more tin bond deposits including tin. The method can include heating the first substrate to a tin contact bond formation temperature. The method can include pressing the first substrate against a second substrate to form one or more tin contact bonds from the one or more tin bond deposits. The method can include depositing, on at least one of the first substrate or a third substrate, one or more second bond deposits, the one or more second bond deposits forming contact bonds at a second contact bond formation temperature, the second contact bond formation temperature being less than a melting point of the one or more tin contact bonds. The method can include heating at least one of the first substrate or the third substrate to the second contact bond formation temperature and not exceeding the melting point of the one or more tin contact bonds. The method can include pressing the first substrate against the third substrate to form one or more second contact bonds from the one or more second bond deposits.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
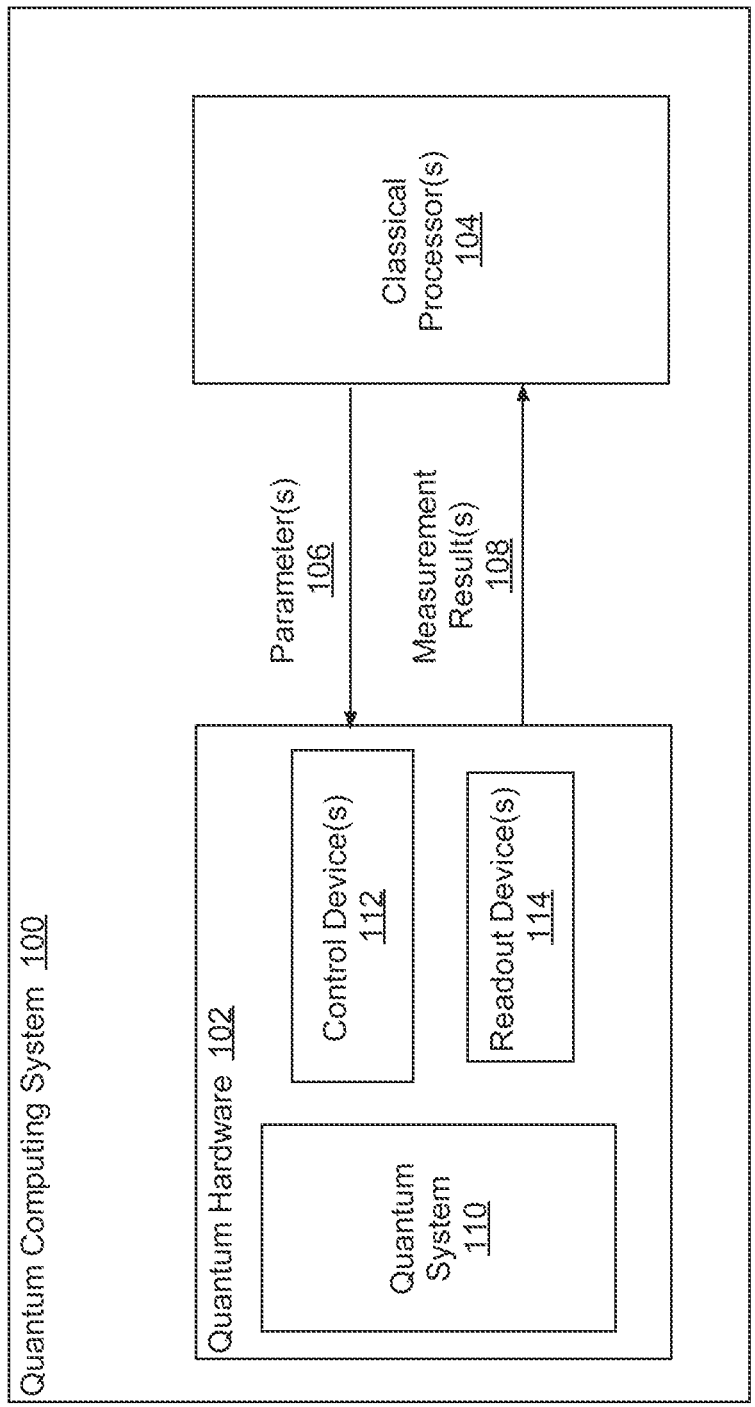
FIG. 1 depicts an example quantum computing system according to example embodiments of the present disclosure.

Example aspects of the present disclosure are directed to superconducting contact bonds having improved fabrication process tolerance. More particularly, example aspects of the present disclosure are directed to superconducting contact bonds incorporating tin and/or tin alloys to provide improved fabrication process tolerance in addition to desirable performance for quantum computing applications. The superconducting contact bonds incorporating tin and/or tin alloys (hereinafter, "tin contact bonds") can provide for improved fabrication process tolerance, such as improved tolerance for additional processing steps subsequent to formation of the tin contact bonds. In addition, the tin contact bonds can provide for superconductivity and other characteristics suitable for use in quantum computing applications, such as for bump bonding quantum computing substrates (e.g., quantum boards, wafers, etc.). The superconducting contact bonds can include tin bump bonds, which are configured to provide electrical interconnection between two substrates, and tin hermetic seals, which are configured to hermetically seal circuit elements, and/or other suitable contact bonds.

For instance, in some implementations, a quantum computing system can include a first substrate. The first substrate can include, for example, one or more quantum control devices. The quantum computing system can additionally include a second substrate. The second substrate may be aligned with the first substrate. The second substrate can include, for example, one or more quantum circuit elements (e.g., qubit structures). One or more tin contact bonds can be formed on the first substrate and the second substrate. The one or more tin contact bonds can include a superconducting bump bond between the one or more quantum control devices and the one or more quantum circuit elements. The tin contact bonds either can be or can include tin. For instance, the tin contact bonds can be exclusively tin or the tin contact bonds can be or include a superconducting tin alloy. The superconducting tin alloy can include at least one of lead, bismuth, antimony, gold, niobium, copper, cadmium, silver, indium, or gallium. For instance, the superconducting tin alloy may be primarily tin (e.g., include a greater amount of tin than other metals). The superconducting tin alloy can be superconducting at temperatures less than about 1 kelvin. According to example aspects of the present disclosure, a third substrate having (e.g., indium) contact bonds having a lower formation temperature than the tin contact bonds can be coupled to the first and/or second substrate(s).

Quantum computing entails coherently processing quantum information stored in the qubits of a quantum computer. In certain types of quantum computing processors, the qubits of the quantum processor are coupled together in a controllable manner such that the quantum state of each quantum circuit element affects the corresponding quantum states of the other quantum circuit elements to which it is coupled. Depending on the processor design, the chosen architecture may limit the density and total number of qubits available for coupling, and thus limit the ability of the processor to perform complex problems requiring large numbers of qubits. Furthermore, in certain quantum computing designs, the qubits may suffer energy loss and decoherence due to interactions with two level systems. For instance, in quantum computers that use qubits formed from superconductor materials, the presence of lossy non-superconducting materials from, e.g., classical circuit elements with which the quantum computers communicate, and from the connections between the classical circuit elements and the quantum circuit elements can lead to increased decoherence. The use of superconducting bonds (e.g., contact bonds) to bond quantum circuit elements and/or other quantum computing system components can be beneficial for reducing the use of non-superconducting materials.

To increase qubit density and expand the number of qubits available for coupling in a quantum processor, such as a quantum processor having superconducting quantum circuit elements, the processor and associated circuit elements (e.g., control elements) can be constructed using 3D integration. That is, instead of fabricating the quantum circuit elements of the processor within a single plane of a chip that extends along one and/or two dimensions (e.g., x- and/or y-directions), the quantum circuit elements can also be formed in multiple chips that are coupled together along a third dimension (e.g., z-direction). An approach for achieving 3D integration, without introducing lossy processing/dielectrics, is to couple the chips using bump bonding, in which the chips are joined to one another by superconducting bump bonds. Similarly, in some implementations, chips having classical circuit elements can also be coupled to chips including quantum circuit elements using 3D integration and superconducting bump bonds. By using superconducting bump bonds for coupling, it is possible to achieve a reduction in the energy loss and decoherence that can otherwise occur with lossy non-superconducting materials. Furthermore, to avoid the formation of alloys between the superconducting contact bond and any underlying interconnection pads on a chip, barrier layers can be provided to prevent diffusion of materials from the contact bonds to the interconnection pads and vice versa.

Contact bonds (e.g., bump bonds) can provide for a large number of electrical and/or structural interconnects between two substrates. Contact bonds may be formed by depositing bond material (e.g., a conductive material), referred to herein as a bond deposit, on a first substrate and/or a second substrate, placing the substrates in a vacuum chamber or other processing system, heating the bond deposit to or above a contact bond formation temperature (e.g., about a melting point of the bond material) such that the bond material is nonrigid, pressing the first substrate together with a second substrate such that the bond deposit adheres to the second substrate (e.g., a bond deposit on the second substrate), and cooling the substrates to form a persistent contact bond between the first substrate and the second substrate. In some implementations, surface oxides on the bond material surface can be removed (e.g., by chemical etching) prior to forming the contact bonds.

The bump bonds can be useful for forming electrical interconnects between substrates, such as connecting ground lines and/or signal lines. In addition to forming bump bonds between bonded substrates, the bump bonding process described herein can be useful in forming hermetic seals to hermetically seal portions of bonded substrates, such as simultaneously with the bump bonding process. For example, hermetic seals can be formed to hermetically seal electrically interconnected regions to prevent damage to circuits, electrical interconnects (e.g., bump bonds) from oxidation, impurities, or other contamination, which may degrade performance of the bump bonds and/or circuits (e.g., quantum processors). Superconducting materials (e.g., metals and/or alloys) may be used to form the hermetic seals such that the hermetic seals are electrically lossless.

However, the presence of contact bonds (e.g., metal included in the contact bonds) can present challenges in subsequently processing the substrates, such as performing subsequent process steps for the manufacture of a quantum computing system (e.g., a quantum processor). For instance, the subsequent processing may be limited to temperatures below the contact bond formation temperature, as heating the substrates to about the contact bond formation temperature and/or a melting point of the bond material after the bump bonds and/or hermetic seals are formed may compromise the integrity of the contact bonds. As one example, substrates may be limited to a single instance of bump bonding, as attempting to bond additional boards by heating the board will damage existing contact bonds. Additionally, processing steps such as forming vias, attaching components, quantum circuit elements (e.g., qubit structures), etc., can be complicated by the low melting points of (e.g., indium) contact bonds.

This problem is especially challenging in combination with requirements of quantum computing systems (e.g., quantum processors), such as absence of oxides, superconductivity requirements, strong bond requirements, hermetical seal integrity requirements, among others. For instance, indium may be employed to form superconducting contact bonds. While indium may present desirable characteristics for superconducting contact bonds, indium has a relatively low melting point, which can be especially challenging for fabrication processes. For instance, many fabrication processes can require processing steps that exceed a melting point of indium. This can result in decreased capability of completed quantum computing systems (e.g., quantum processors).

According to example aspects of the present disclosure, a contact bond can be formed of tin and/or tin alloy. The tin alloy can be or can include any suitable materials for improving characteristics of the tin alloy for quantum computing applications, such as, for example, mechanical properties (e.g., flexibility), electrical characteristics (e.g., superconductivity), resistance to oxidation, and/or other suitable characteristics. As examples, the tin alloy can be or can include tin and (e.g., in greater concentration than) any one or more of lead, bismuth, antimony, gold, niobium, copper, cadmium, silver, indium, and/or gallium. The tin alloy can be a superconducting tin alloy. The superconducting tin alloy can be superconducting at temperatures less than about 1 kelvin.

The use of tin and/or a tin alloy in superconducting contact bonds (e.g., bump bonds, hermetic seals) for quantum computing applications (e.g., quantum processors) according to example aspects of the present disclosure can provide for a number of improvements to quantum computing systems and/or manufacture thereof. As one example, tin and/or tin alloys can provide a high yield during manufacture, which can be beneficial in manufacturing processes such as deposition. The tin and/or tin alloy can additionally be soft enough to facilitate bump bonding without deforming. Additionally, tin can be resistive to oxide layers or other forms of oxidation. For instance, a superconducting tin alloy can be resistant to oxidation (e.g., compared to pure tin). As an example, the tin alloy can have a reduced oxide layer formation compared to tin in common conditions. As another example, tin and/or a tin alloy may not experience the formation of a detrimental oxide layer under normal operating conditions of the quantum computing system.

Example aspects of the present disclosure can be directed to a method for forming superconducting tin contact bonds. The method can include depositing, on a first substrate, one or more tin bond deposits. The one or more tin bond deposits can include a bond material used to form a bump bond and/or hermetic seal, and, according to example aspects of the present disclosure, including tin (e.g., a tin alloy). The tin bond deposits can be deposited by any suitable deposition process. For instance, in some implementations, the tin bond deposits can be deposited by a sputtering deposition process. Tin and/or other alloy materials may be sputtered against the first substrate, which can provide for precise composition control. At least one of the first substrate or the second substrate can be or can include a silicon wafer. Additionally and/or alternatively, in some implementations, the first and/or second substrate(s) can be any suitable substrate such as a sapphire substrate. In some implementations, one of the first substrate or the second substrate can include one or more quantum circuit elements (e.g., qubit structures) and another of the first substrate or the second substrate can include one or more (e.g., quantum) control devices (e.g., control circuits) configured to control the one or more qubits and/or other components of the quantum computing system. For instance, the quantum circuit elements and/or (e.g., quantum) control devices can be mounted to or otherwise attached to the substrates.

The method can include heating the first substrate to a tin contact bond formation temperature. For instance, the tin contact bond formation temperature can be about a melting point of the tin bond deposits, such as a melting point of tin and/or the tin alloy. When the substrates are heated to the tin contact bond formation temperature, the tin bond deposits can become melted or otherwise malleable such that the bond deposits can be bonded to a second substrate.

The method can include pressing the first substrate against a second substrate to form one or more tin contact bonds from the one or more tin bond deposits. For instance, the first substrate and the second substrate can be mated at the tin contact bond formation temperature to form the one or more tin contact bonds. In some implementations, the method can further include aligning the first substrate and the second substrate. For instance, contact points (e.g., bond deposits) may be aligned to make precise contact when the substrates are mated.

In some implementations, prior to pressing the first substrate against the second substrate, the method can include depositing, on the second substrate, one or more second tin bond deposits. The one or more second tin bond deposits can include tin (e.g., a tin alloy). The one or more tin contact bonds are formed from the one or more second tin bond deposits. The second tin bond deposits can be identical to the tin bond deposits on the first substrate. When the first substrate and second substrate are mated, the second substrate (e.g., the second tin bond deposits) can additionally be heated to the tin contact bond formation temperature.

The one or more tin contact bonds can include one or more bump bonds between the first substrate and the second substrate. The bump bonds can be formed, for example, on interconnect pads on the first and/or second substrate. The bump bonds can be configured to transmit signals (e.g., control signals, etc.) between the first and second substrates. The bump bonds can additionally be used to couple grounds. Additionally and/or alternatively, the one or more tin contact bonds can include one or more hermetic seals. The hermetic seals can hermetically seal portions of the substrates (e.g., one or more areas or volumes between the substrates) when bonded. For example, hermetic seals can be formed to hermetically seal electrically interconnected regions to prevent damage to the bump bonds from oxidation, impurities, or other contamination, which may degrade performance of the bump bonds. Superconducting materials (e.g., metals and/or alloys) may be used to form the hermetic seals such that the hermetic seals are electrically lossless. Similarly to the bump bonds, hermetic seals may be formed by bond deposits and when heated and pressed together.

In some implementations, the method can further include coating the one or more tin bond deposits with a capping layer. The capping layer can be formed of any suitable material, such as, for example, titanium nitride. The capping layer can be broken when the first substrate is pressed against the second substrate to form the one or more tin contact bonds. The broken portion of the capping layer may facilitate electrical transfer throughout the contact bonds. The remaining, unbroken portion of the capping layer can seal the tin contact bonds from negative factors such as tin pest, tin whiskers, oxidation, or other negative factors. The capping layer can be beneficial in using tin for a contact bond according to example aspects of the present disclosure.

According to example aspects of the present disclosure, the method can further include performing one or more subsequent process steps subsequent to pressing the first substrate against the second substrate to form the one or more tin contact bonds from the one or more tin bond deposits. The one or more subsequent process steps can include heating at least one of the first substrate or the second substrate to a temperature less than the tin contact bond formation temperature, such as, more particularly, less than a melting point of the one or more tin contact bonds. For instance, the one or more subsequent process steps can include attaching additional components to the substrates, which may include heating the substrate. Using tin contact bonds can allow the substrates to be heated hot enough during the subsequent processing steps for steps such as, for example, attaching quantum circuit elements or other circuits, forming vias, adding new substrates, or other suitable subsequent processing steps, without melting or otherwise degrading the tin contact bonds.

Example aspects of the present disclosure may also be directed to a method of forming multilayer superconducting contact bonds, or for bonding substrates by a tin contact bond. The method can include depositing, on a first substrate, one or more tin bond deposits. The one or more tin bond deposits can include tin (e.g., a tin alloy). The tin bond deposits can be deposited by any suitable deposition process. For instance, in some implementations, the tin bond deposits can be deposited by a sputtering deposition process. Tin and/or other alloy materials may be sputtered against the first substrate, which can provide for precise composition control. At least one of the first substrate or the second substrate can be or can include a silicon wafer. In some implementations, one of the first substrate or the second substrate can include one or more quantum circuit elements (e.g., qubit structures) and another of the first substrate or the second substrate can include one or more control devices configured to control the one or more quantum circuit elements. For instance, the quantum circuit elements and/or control devices can be mounted to or otherwise attached to the substrates.

The method can include heating the first substrate to a tin contact bond formation temperature. For instance, the tin contact bond formation temperature can be about a melting point of the tin bond deposits, such as a melting point of tin and/or the tin alloy. When the substrates are heated to the tin contact bond formation temperature, the tin bond deposits can become melted or otherwise malleable such that the bond deposits can be bonded to a second substrate.

The method can include pressing the first substrate against a second substrate to form one or more tin contact bonds from the one or more tin bond deposits. For instance, the first substrate and the second substrate can be mated at the tin contact bond formation temperature to form the one or more tin contact bonds. In some implementations, the method can further include aligning the first substrate and the second substrate. For instance, contact points (e.g., bond deposits) may be aligned to make precise contact when the substrates are mated.

In some implementations, prior to pressing the first substrate against the second substrate, the method can include depositing, on the second substrate, one or more second tin bond deposits. The one or more second tin bond deposits can include tin (e.g., a tin alloy). The one or more tin contact bonds are formed from the one or more second tin bond deposits. The second tin bond deposits can be identical to the tin bond deposits on the first substrate. When the first substrate and second substrate are mated, the second substrate (e.g., the second tin bond deposits) can additionally be heated to the tin contact bond formation temperature.

The one or more tin contact bonds can include one or more bump bonds between the first substrate and the second substrate. The bump bonds can be formed, for example, on interconnect pads on the first and/or second substrate. The bump bonds can be configured to transmit signals (e.g., control signals, etc.) between the first and second substrates. The bump bonds can additionally be used to couple grounds. Additionally and/or alternatively, the one or more tin contact bonds can include one or more hermetic seals. The hermetic seals can hermetically seal portions of the substrates (e.g., one or more areas or volumes between the substrates) when bonded. For example, hermetic seals can be formed to hermetically seal electrically interconnected regions to prevent damage to the electrical interconnects (e.g., bump bonds) from oxidation, impurities, or other contamination, which may degrade performance of the bump bonds. Superconducting materials (e.g., metals and/or alloys) may be used to form the hermetic seals such that the hermetic seals are electrically lossless. Similarly to the bump bonds, hermetic seals may be formed by bond deposits and when heated and pressed together.

In some implementations, the method can further include coating the one or more tin bond deposits with a capping layer. The capping layer can be formed of any suitable material, such as, for example, titanium nitride. The capping layer can be broken when the first substrate is pressed against the second substrate to form the one or more tin contact bonds. The broken portion of the capping layer may facilitate electrical transfer throughout the contact bonds. The remaining, unbroken portion of the capping layer can seal the tin contact bonds from negative factors such as tin pest, tin whiskers, oxidation, or other negative factors. The capping layer can be beneficial in using tin for a contact bond according to example aspects of the present disclosure.

The method can include depositing, on at least one of the first substrate or a third substrate, one or more second bond deposits. The one or more second bond deposits can be formed of a different material than the tin contact bonds, such as indium. The one or more second bond deposits can form contact bonds at a second contact bond formation temperature. The second contact bond formation temperature can be less than a melting point of the one or more tin contact bonds. For instance, contact bonds can be formed of the second bond deposits without degrading the tin contact bonds due to the second contact bond formation temperature being less than a melting point of the one or more tin contact bonds. In some cases, depositing the one or more second bond deposits can include depositing the one or more second bond deposits by an evaporative deposition process. In some cases, the tin contact bonds may be deposited by a sputtering deposition process, as evaporation may not be possible for e.g. alloys.

The method can include heating the at least one of the first substrate or the third substrate to the second contact bond formation temperature and not exceeding a melting point of the tin contact bonds. For instance, by not exceeding the melting point of the tin contact bonds, the tin contact bonds remain intact.

The method can include pressing the first substrate against the third substrate to form one or more second contact bonds from the one or more second bond deposits. In some implementations, the method can include, prior to pressing the first substrate against the third substrate, depositing, on the third substrate, one or more additional second bond deposits. The one or more second contact bonds can be formed from the one or more additional second tin bond deposits. In some implementations, the method can further include aligning the first substrate and the third substrate. For instance, contact points (e.g., bond deposits) may be aligned to make precise contact when the substrates are mated.

Example multilayer substrate assemblies of the present disclosure are described herein with reference to a first, second, and/or third substrate. It should be understood that example aspects of the present disclosure can provide for any suitable number of substrates, such as greater than three substrates, to be bonded using contact bonds.

Systems and methods according to example aspects of the present disclosure can provide for a number of technical effects and benefits. For instance, incorporating tin contact bonds according to example aspects of the present disclosure can provide for improved manufacturing processes of quantum computing systems, such as provide for performance of subsequent processing steps. As an example, a higher melting point afforded by the use of tin contact bonds can provide for improved subsequent processing capabilities, such as formation of multilayer substrate assemblies, and/or other advantages. The improved manufacturing processes can provide for higher quality quantum computing systems, such as quantum computing systems having improved circuit density and/or qubit density provided for by the improved manufacturing process. This can result in quantum computing systems (e.g., quantum processors) having improved coherence, reliability, improved processing capability, improved qubit density, and/or other improvements. Additionally and/or alternatively, the use of tin and/or a tin alloy can provide for the use of sputtering deposition processes, which may have been difficult or impossible with conventional materials (e.g., indium), which may have required, for example, evaporative deposition processes. Because many additional components on substrates (e.g., interconnect pads) are conventionally deposited by sputtering, this can result in faster processing, as the additional components (e.g., interconnect pads) and bond deposits can be deposited in a same chamber without requiring transfer of the substrates.

With reference now to the FIGS., example embodiments of the present disclosure will be discussed in further detail. As used here, the use of the term "about" in conjunction with a value refers to within 20% of the value.

FIG. 1 depicts an example quantum computing system 100 according to example embodiments of the present disclosure. The example system 100 is an example of a system on one or more classical computers or quantum computing devices in one or more locations, in which the systems, components, and techniques described below can be implemented. Those of ordinary skill in the art, using the disclosures provided herein, will understand that other quantum computing structures or systems can be used without deviating from the scope of the present disclosure.

The system 100 includes quantum hardware 102 in data communication with one or more classical processors 104. The quantum hardware 102 includes components for performing quantum computation. For example, the quantum hardware 102 includes a quantum system 110, control device(s) 112, and readout device(s) 114 (e.g., readout resonator(s)). The quantum system 110 can include one or more multi-level quantum subsystems, such as a register of qubits. In some implementations, the multi-level quantum subsystems can include superconducting qubits, such as flux qubits, charge qubits, transmon qubits, gmon qubits, etc.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 110 via multiple control lines that are coupled to one or more control devices 112. Example control devices 112 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust the frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 102 through physical control parameters (e.g., microwave pulses) that are sent through wires included in the quantum hardware 102. Further examples of control devices include arbitrary waveform generators, wherein a DAC (digital to analog converter) creates the signal.

The readout device(s) 114 may be configured to perform quantum measurements on the quantum system 110 and send measurement results 108 to the classical processors 104. In addition, the quantum hardware 102 may be configured to receive data specifying physical control qubit parameter values 106 from the classical processors 104. The quantum hardware 102 may use the received physical control qubit parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

The readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

Figure 2:
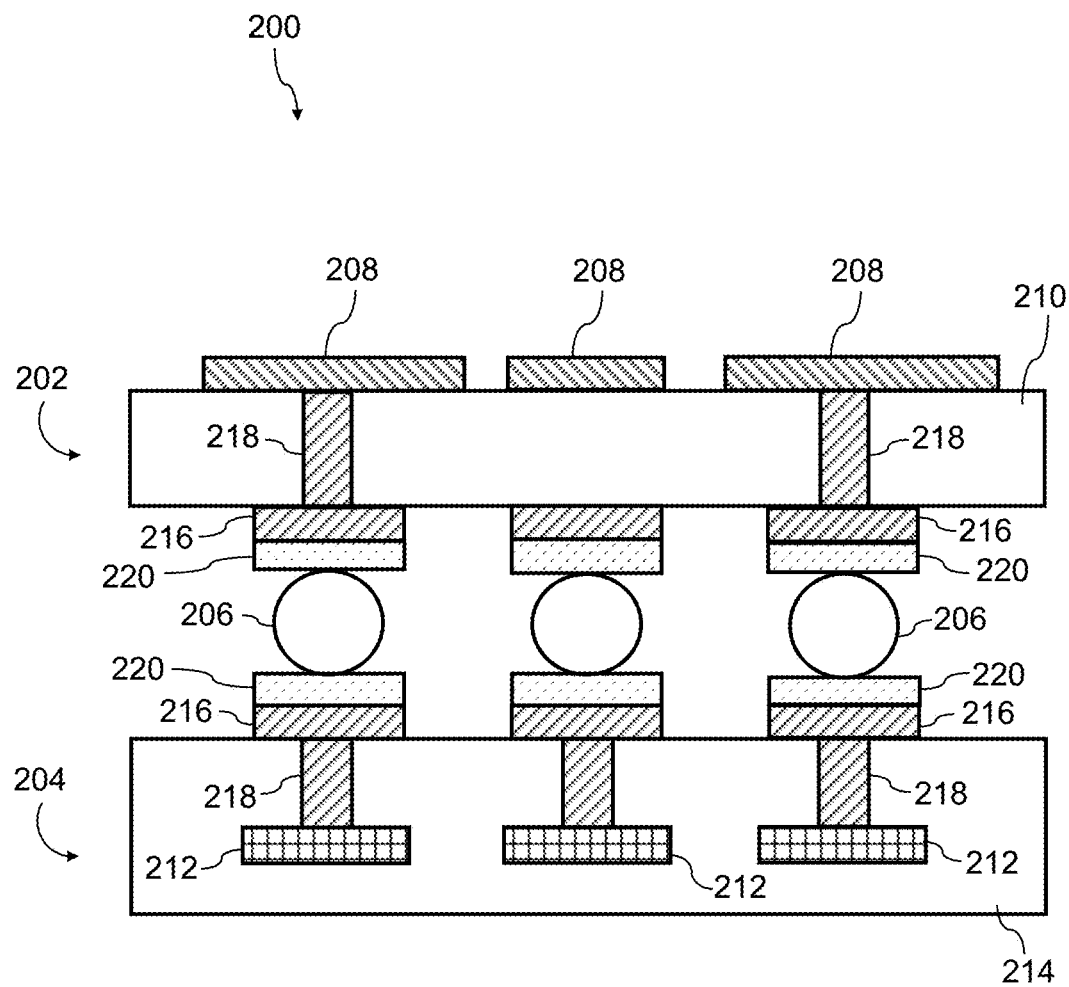
FIG. 2 depicts a diagram illustrating an example of a device that includes a first substrate that is joined (e.g., bonded) to a second substrate by one or more superconducting (e.g., tin) contact bonds according to example embodiments of the present disclosure.

FIG. 2 depicts a diagram illustrating an example of a device 200 that includes a first substrate assembly 202 that is joined (e.g., bonded) to a second substrate assembly 204 by one or more superconducting (e.g., tin) contact bonds 206 according to example embodiments of the present disclosure. The superconducting tin bonds may be formed of tin or tin alloy, as described herein. As used herein, a "superconducting" material (e.g., a tin alloy) may be superconducting when cooled below a certain temperature, such as less than about 1 kelvin.

Each substrate can include one or more circuit elements for performing data processing operations. For example, the first substrate assembly 202 can include one or more first circuit elements 208 formed on a substrate 210. The first circuit elements 208 can include, e.g., quantum circuit elements for use in performing quantum processing operations, such as qubits. For instance, the quantum circuit elements can be configured to make use of quantum-mechanical phenomena, such as superposition and entanglement, to perform operations on data in a non-deterministic manner. Certain quantum circuit elements, such as qubits, can be configured to represent and operate on information in more than one state simultaneously. In some implementations, quantum circuit elements include circuit elements formed in part from superconducting materials such as, for example, superconducting co-planar waveguides, quantum LC oscillators, flux qubits, superconducting quantum interference devices (SQUIDS) (e.g., RF-SQUID or DC-SQUID), among others. A superconductor material includes a material that exhibits superconductor properties at or below a corresponding superconducting critical temperature, such as aluminum (e.g., superconducting critical temperature of 2.2 Kelvin) or niobium (e.g., superconducting critical temperature of 9.3 Kelvin). The circuit elements 208 can, depending on element type and design, be formed of one or more layers of material such as, e.g., superconducting materials and dielectrics. To reduce energy loss and decoherence, the substrate 210 for quantum circuit elements can be formed from a low loss dielectric material, such as single crystalline silicon or sapphire.

The second substrate assembly 204 includes one or more second circuit elements 212 formed on or within substrate 214. The second circuit elements 212 also can include quantum circuit elements as described herein. Similarly, the substrate 214 can be formed from a low loss dielectric material suitable for quantum circuit elements, such as single crystalline silicon or sapphire. Alternatively, the second circuit elements 212 include classical circuit elements. Classical circuit elements generally process data in a deterministic manner and include, e.g., circuit elements such as rapid single flux quantum (RSFQ) devices. RSFQ is a digital electronics technology that uses superconducting devices, namely Josephson junctions, to process digital signals. In RSFQ logic, information is stored in the form of magnetic flux quanta and transferred in the form of Single Flux Quantum (SFQ) voltage pulses. Josephson junctions are the active elements for RSFQ electronics, just as transistors are the active elements for semiconductor electronics. RSFQ is one family of superconducting or SFQ logic. Others include, e.g., Reciprocal Quantum Logic (RQL) and ERSFQ, which is an energy-efficient version of RSFQ that does not use bias resistors. Other examples of classical circuit elements include digital or analog complementary metal oxide semiconductor (CMOS) devices. Data manipulated by digital circuit elements typically are represented in either one of two different states, e.g., a 0 or 1. The classical circuit elements 212 may be configured to collectively carry out instructions of a computer program by performing basic arithmetical, logical, and input/output operations on data, in which the data is represented in analog or digital form. For instance, in some implementations, the classical circuit elements 212 can be or can include quantum control devices. In some implementations, classical circuit elements 212 of the second substrate assembly 204 can be used to transmit data to and receive data from the quantum circuit elements fabricated on the first substrate assembly 202 through electrical connections established by the superconducting contact bonds 206. Though shown in FIG. 2 as single components, the classical circuit elements 212 can be constructed using layers of different materials (e.g., semiconductors, dielectrics and metals) as is known in standard CMOS fabrication. An advantage to using these fabrication methods is that they allow wiring to be routed in relatively complex 3D geometries, enabling greater numbers of connections among the qubit structures in substrate assembly 202 and through the bonds 206. The substrate 214 can be formed from materials such as single crystal silicon, silicon germanium, or gallium arsenide, among others.

In some cases, classical circuit elements may not be formed on or within the same substrate as the quantum circuit elements. This is because, at least in some implementations, the dielectrics (e.g., SiO$_2$) and/or non-superconducting metals used to fabricate classical circuit elements could be sources of energy loss and decoherence, such that they interfere with the quantum circuit elements and render operation of the quantum processor inefficient and unreliable. By coupling the second substrate assembly 204 to the first substrate assembly 202 with superconducting tin contact bonds 206, however, it is possible to reduce the decoherence effects of the classical circuit elements and/or materials on the quantum circuit elements. According to example aspects of the present disclosure, the contact bonds 206 may be formed of tin and/or a tin alloy (e.g., tin or tin alloy coated with a capping layer) to enable subsequent fabrication processing of the substrates 202, 204.

In some cases, contact bonds are formed on interconnect pads 216 that provide an electrical connection to the circuit elements of substrate assembly 202 and to the circuit elements of substrate assembly 204. For example, in some implementations, the interconnect pads 216 of the first substrate assembly 202 are electrically connected to one or more of the first circuit elements 208 through interconnects 218 formed on and/or within the substrate 210. The interconnect pads 216 of the second substrate assembly 204 are electrically connected to one or more of the second circuit elements 212 through interconnects 218 formed on and/or within the substrate 214. Though interconnects 218 and circuit elements 212 are shown as extending through the substrate 210, the interconnects 218 and circuit elements 212 can instead be formed as part of a single layer of metallization on the substrate surface (e.g., co-planar with pads 216). When the interconnect pads 216 are arranged on a substrate containing quantum circuit elements, the pads 216 can be formed from a superconducting material to reduce decoherence and energy loss. Similarly, the pads 216 and interconnects 218 on substrate assembly 204 can be formed from a superconducting material to reduce the heat generated from substrate assembly 204. For instance, the interconnect pads 216 and interconnects 218 on substrate assembly 202 can be formed of aluminum, which is a superconducting metal used for fabricating quantum circuit elements. Other superconducting materials that can be used for pads 216 and interconnects 218 include, e.g., niobium or titanium nitride. The interconnects 218 and pads 216 of the second substrate assembly 204 also may be formed from superconducting materials, such as aluminum, niobium or titanium nitride, or, in some implementations, non-superconducting electrically conductive materials.

In some cases, such as to avoid the formation of alloys between the superconducting contact bond 206 and the interconnecting pads 216, a barrier layer 220 is arranged between the superconducting contact bonds 206 and the interconnecting pads 216. The barrier layer 220 includes a superconducting material that also serves as an electrically conducting barrier that blocks diffusion of the bond material (e.g., tin) into the interconnecting pad 216 and/or vice-versa.

FIGS. 3A through 3E depict stages of forming superconducting contact bonds 206 according to example embodiments of the present disclosure. For instance, FIGS. 3A through 3E progressively illustrate how various components can be added to substrates 202, 204 to form the contact bonds 206.

Figure 3A:
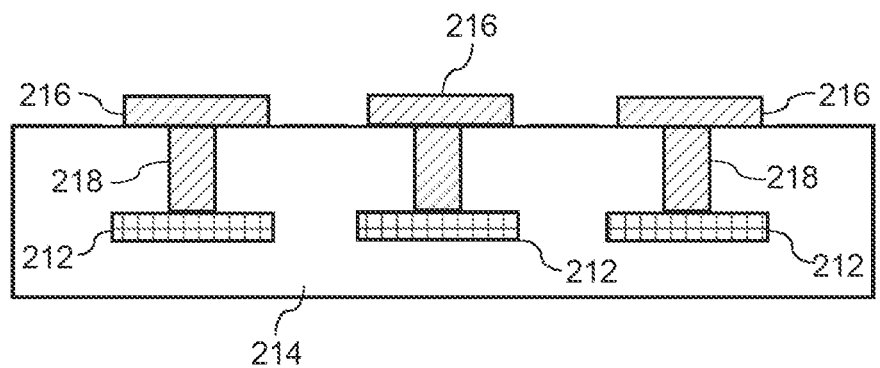
FIGS. 3A through 3E depict stages of forming superconducting contact bonds according to example embodiments of the present disclosure.

FIG. 3A is a schematic illustrating an example of the first substrate 214. The first substrate 214 can include, for example, a single crystalline silicon wafer in which one or more circuit elements 212 are formed. Alternatively, the substrate 214 and circuit elements 212 can correspond to a die obtained from a wafer that has been diced. As explained herein, the circuit elements 212 can include quantum circuit elements or classical circuit elements. For the present example, it is assumed that the circuit elements 212 are classical circuit elements and the substrate 214 is a single crystalline silicon substrate. The circuit elements 212 can be electrically connected to one or more interconnect pads 216 through interconnects 218. The interconnects 218 can be formed, e.g., from a superconducting material or other electrically conductive material through a combination of photolithography to define openings within the substrate 214, as well as deposition and removal techniques, such as vapor deposition and wet or dry etching, to fill the opening with the interconnect material. Though shown being formed in the body of the substrate 214, the interconnects 218 can be formed on a surface of the substrate 214 instead. The interconnect pads 216 can be formed, e.g., from aluminum or another material that is superconducting. The interconnect pads 216 can also be deposited and defined using a combination of photolithography, and standard deposition and wet or dry etching techniques.

Next, the surfaces of the interconnect pads 216 are prepared. In some implementations, the metal interconnect pads have a thin native oxide layer on their surface. For instance, aluminum can have a layer of AlOx. The thin native oxide layer is insulating, reducing the electrical conductivity of the connection to the superconducting contact bond. To remove the native oxide, the surface of the interconnect pad 216 is exposed to an ion milling process. Ion milling includes delivering ions (e.g., Ar ions) to the surface of the interconnect pads 216 from an angle, such that material is sputtered from the surface. Typically, the ion milling process is performed under vacuum conditions. For instance, the ion milling can be performed under a vacuum pressure of 3 mTorr and temperature of about 28° C.

Figure 3B:
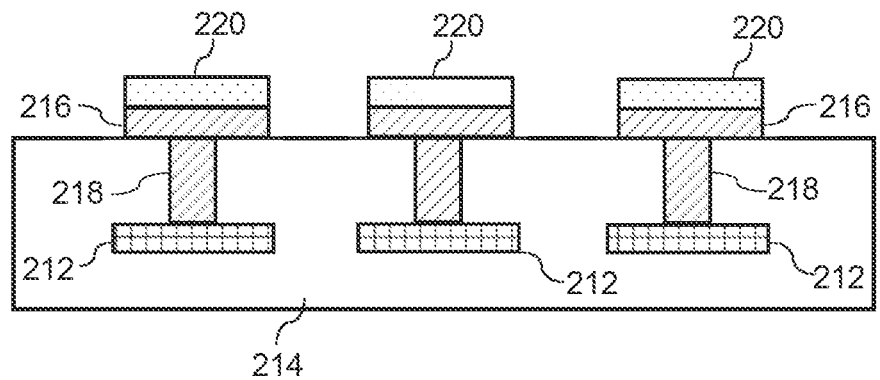

Once the native oxide is removed, a barrier layer 220 is deposited on the prepared surfaces of the interconnect pads 216. The barrier layer includes a material that blocks diffusion of the bond material into the interconnect pad 216 and/or vice-versa, but also retains superconductivity. The barrier layer also preferably does not form an alloy itself with either the interconnect pad 216 or the superconducting contact bond to be formed. To reduce decoherence that might be induced in nearby quantum circuit elements by the barrier layer, the barrier layer material may be formed from a superconductor material. For example, the barrier layer material can be formed from titanium nitride (having a superconducting critical temperature of about 4.2 K). Alternatively, the barrier layer material can include a metal that becomes superconducting via the proximity effect, such as platinum or tungsten. Deposition of the barrier layer can include, e.g., performing reactive sputtering. Reactive Sputtering is a process where a target of one chemical composition is sputtered in the presence of a gas or a mixture of gasses (e.g., Ar ions or N2) that will react with the target material to form a coating of a different chemical composition. Argon is in most cases the main gas and the amount of a reactive gas introduced into a process chamber is controlled to produce a fully reacted compound. As an example, reactive sputtering can be performed using a mixture of Ar and N2 under a base pressure of about 2*10–8 Torr and a background pressure of about 3 mTorr and temperature of about 28° C. After deposition of the barrier layer material, the barrier layer material may be patterned so as to just cover the surfaces of the interconnect pads 216, and thus form layers 220 as shown in FIG. 3B. Patterning of the barrier layer material can entail using, e.g., photolithography to define the regions where the barrier layer material will remain followed by wet and/or dry etching of the barrier layer material in areas where the barrier layer material is to be removed. Alternatively, a lift-off process can be used, where the barrier layer material is deposited over a layer of patterned photoresist. In regions where the barrier layer material is to be removed, a solvent then is used to effectively "lift-off" the photoresist and barrier layer material coating. In either case, following patterning of the barrier layer material, the chip is exposed to an $O_2$ plasma to remove any remaining photoresist and/or other organic materials that may be on the surfaces of the chip.

Figure 3C:
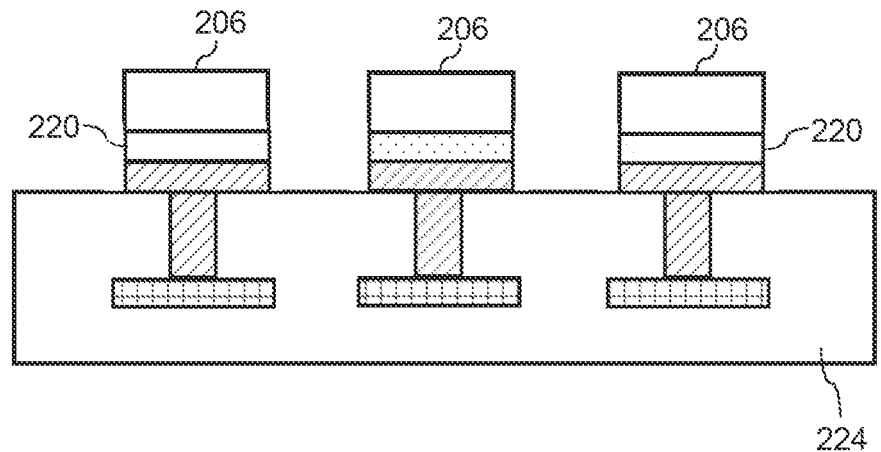

After deposition and patterning of the barrier layer, the exposed surfaces of the barrier layers 220 can be optionally ion milled. Milling removes traces of native oxide on the barrier layer to increase conductivity and the reliability of the ensuing superconducting joint. Subsequently, a layer of superconducting material that will form the superconducting contact bonds is deposited on the surface of the barrier layers. For instance, the superconducting material that will form the contact bonds can be or can include tin or a tin alloy. The superconducting material can be deposited using, e.g., a thermal evaporation deposition process under vacuum (e.g., at about 1*10–6 Torr). As with the barrier layer 220, the as-deposited superconducting material 206 may be patterned using a combination of photolithography and wet or dry etching techniques to define the contact bond region 206 as shown in FIG. 3C. Alternatively, the superconducting material that will form the contact bonds is patterned using a lift-off process, in which, prior to deposition of the superconductor bond material, a photoresist layer is deposited and patterned. Then, following deposition of the superconductor bond material, the resist and undesired superconductor material overlaying the resist are removed using a solvent.

Figure 3D:
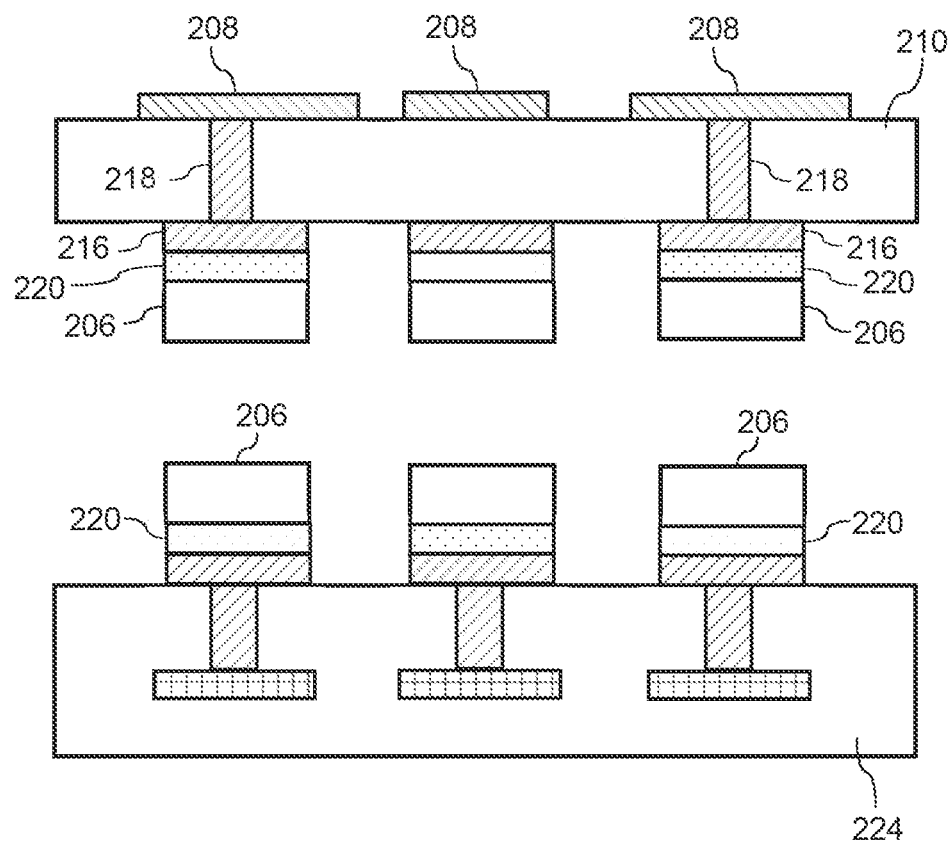

As shown in the example of FIG. 3D, an additional substrate 210 is provided. The additional substrate 210 can also include multiple circuit elements 208. As explained herein, the circuit elements 208 can include quantum circuit elements, such as qubits, for example, superconducting co-planar waveguides, quantum LC oscillators, flux qubits, or SQUIDS, among others. The substrate 210 can be formed from a low-loss dielectric material, such as sapphire or single crystalline silicon, and can be in the form of a wafer or a diced chip. One or more of the circuit elements 208 can be electrically connected to one or more interconnect pads 216 through interconnects 218 that are formed within or on the substrate 210. To reduce decoherence, the interconnects 218 and interconnect pads 216 are formed from a superconducting material, such as aluminum.

The same process for preparing the interconnect pads 216 and forming a barrier layer 220, as described above with respect to FIGS. 3B-3C, can also be performed on the additional substrate. For instance, the surfaces of the interconnect pads 216 can be prepared using, e.g., ion-milling, a superconducting diffusion barrier 220 is deposited and patterned on the prepared surfaces of the interconnect pads 216, the exposed surfaces of the barrier layer can be further ion-milled. Additionally, a layer of superconducting material that will form the superconducting contact bonds can be optionally deposited on the surface of the barrier layers. As explained herein, the superconducting material that will form the contact bonds can include, e.g., tin or tin alloy, deposited using a thermal evaporation deposition process and patterned using a combination of photolithography and wet or dry etching techniques or through a lift-off process.

Figure 3E:
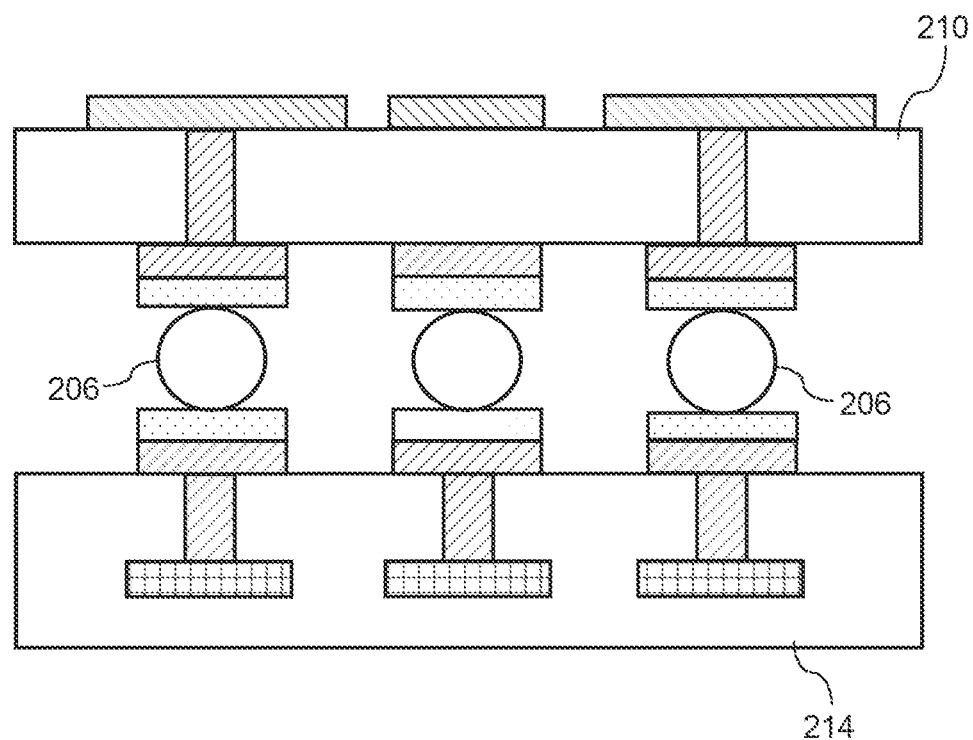

After forming the superconducting contact bonds 206, the two chips are brought together and joined to one another (e.g., using a bump bonder) as shown in FIG. 3E to produce the stacked device. Pressure bonding can be performed without heat applied (e.g., at room temperature). An example of the pressure used to form the bond is 25 Newtons for 1000 bumps in a 6 mm square chip. An advantage of performing the bonding at room temperature (e.g., in the range of between approximately 18° C. and approximately 30° C.) is that the formation of hillocks and voids at material interfaces can be reduced. Such hillocks and voids can otherwise lead to the formation of two-level systems that interfere with operation of nearby quantum circuit elements, leading to decoherence effects. Performing bonding at room temperature also can reduce material diffusion across interfaces between different materials, which is also associated with giving rise to decoherence in quantum circuit elements. The low temperature/room temperature pressure bonding can be performed using, e.g., the FC 150 available from SETNA, LLC. In some implementations, the wafers are diced into separate chips before the chips are joined.

Figure 4:
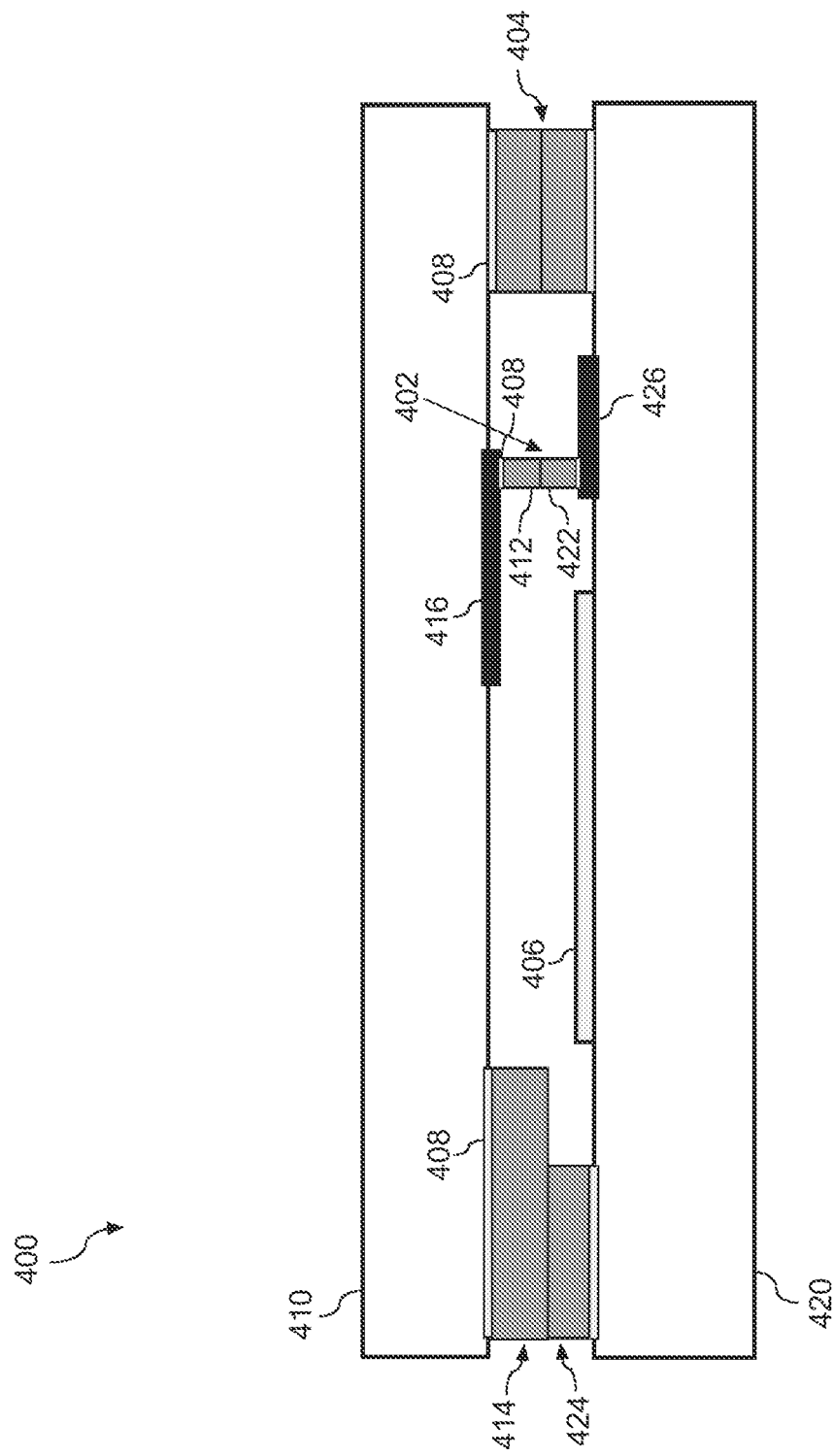
FIG. 4 depicts a diagram of an example substrate assembly according to example embodiments of the present disclosure.

FIG. 4 depicts a diagram of an example substrate assembly 400 according to example embodiments of the present disclosure. The substrate assembly 400 can include first substrate 410 that is bonded to second substrate 420 by one or more tin contact bonds. For instance, one or more tin contact bonds (e.g., bump bond 402, hermetic seal 404) can be formed on the first substrate 410 and the second substrate. The tin contact bonds (e.g., 402, 404) can be formed on interconnect pads 408. The one or more tin contact bonds can include a superconducting bump bond 402, between components on the first substrate 410 and/or the second substrate 420, such as between one or more quantum control devices and one or more quantum circuit elements. For instance, bump bond 402 can provide an electrical interconnect between signal pad 416 (e.g., interconnect pad) of the first substrate 410 and signal pad 426 (e.g., interconnect pad) of the second substrate 420. The signal pads 416, 426 can be configured to convey signals between components on the first and second substrates 410, 420. For instance, one or more contact bonds (e.g., bump bond 402) can provide connection to a ground plane 406. The bump bond 402 can be formed by bond deposits 412, 422 that are respectively deposited on the substrates 410, 420. The substrates 410 and/or 420 can then be heated and pressed against one another to form the bump bond 402.

In addition to bump bonds 402, the contact bonds can be or can include hermetic seal 404. The hermetic seal 404 can hermetically seal portions of substrates 410, 420 (e.g., one or more areas or volumes between substrate 410 and/or 420) when bonded. For example, hermetic seal 404 can be formed to hermetically seal portions of a circuit (e.g., electrically interconnected regions) to prevent damage to the portions (e.g., bump bonds 402) from oxidation, impurities, or other contamination, which may degrade performance of the substrate assembly 400 (e.g., and quantum components connected thereto). Superconducting materials (e.g., metals and/or alloys) may be used to form the hermetic seal 404 such that the hermetic seal 404 is electrically lossless. Similarly to bump bond 402, hermetic seal 404 may be formed by bond deposits 414 and 424 when heated and pressed together.

Figure 5A:
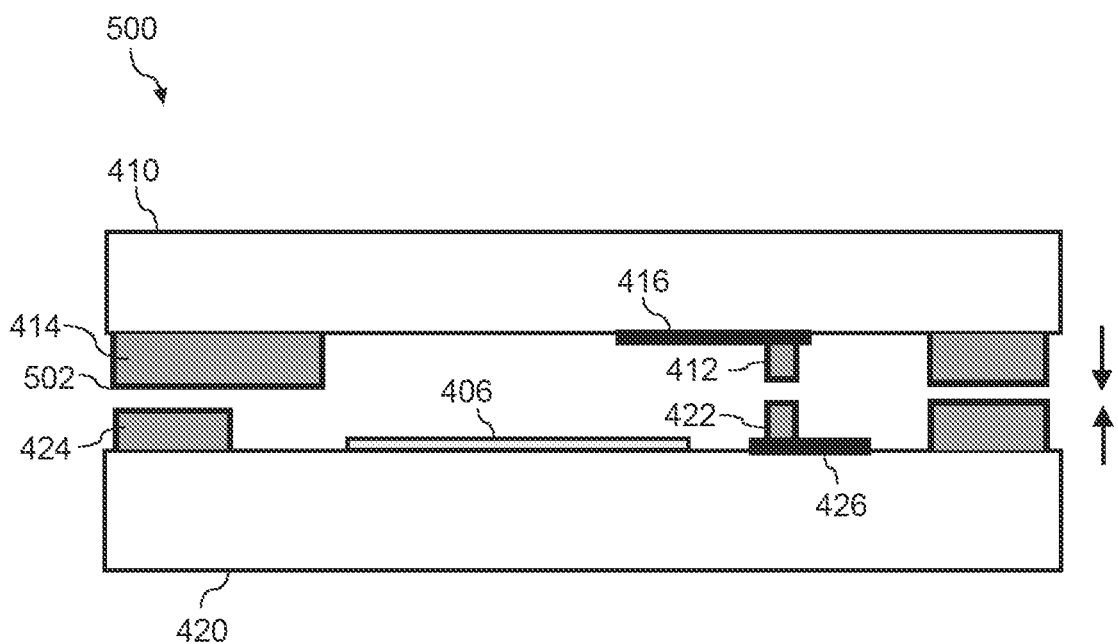
FIGS. 5A and 5B depict substrate assemblies illustrating formation of superconducting contact bonds with a capping layer according to example embodiments of the present disclosure.
Figure 5B:
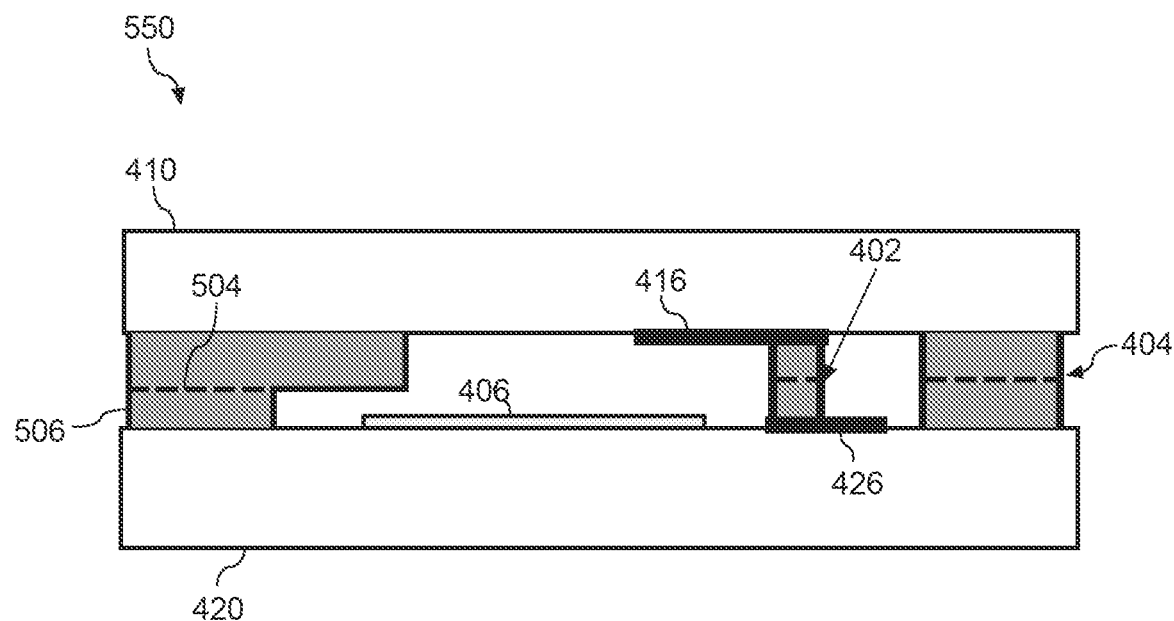

FIGS. 5A and 5B depict substrate assemblies 500 and 550 illustrating formation of superconducting contact bonds with a capping layer according to example embodiments of the present disclosure. As illustrated in FIG. 5A, at assembly 500, prior to mating substrate 410 and 420, the bond deposits (e.g., 412, 414, 422, 424) can be coated with a capping layer 502. For instance, in some implementations, the capping layer 502 can be applied to the bond deposits (e.g., 412, 414, 422, 424) by sputtering deposition, evaporative deposition, or any other suitable manner of coating. The substrates 410 and 420 can be mated or pressed together (e.g., as indicated by directional arrows) to form the substrate assembly as depicted at assembly 550. The capping layer 502 is broken when the first substrate 410 is pressed against second substrate 420 to form the contact bonds (e.g., 402, 404). For instance, as illustrated in FIG. 5B, the capping layer 502 can break at regions where the bond deposits on each substrate meet, such as at regions where bond deposit 414 meets bond deposit 424, as indicated by broken capping layer 504. The remaining unbroken portions of capping layer 502 can thus form a capping layer 506 around the exposed surfaces of the contact bonds (e.g., bump bond 402, hermetic seal 404).

The capping layer 506 can provide for various improvements to the tin contact bonds (e.g., 402, 404). As one example, tin is known to suffer from the so-called "tin pest" problem, where tin experiences a phase change as it is cooled to low temperatures such as those required for superconductivity, which is desirable for quantum computing applications. While uncapped tin may suffer from the tin pest problem, the capping layer 506 can provide for some degree of mitigation of the tin pest problem on the tin contact bonds (e.g., 402, 404). Additionally and/or alternatively, the capping layer 506 can mitigate the effects of the so-called "tin whisker" problem, where tin deposits grow "whiskers" or sharp extrusions (e.g., as a result of electrical signals) over time, gradually decreasing integrity of the tin contact bonds 402, 404. The capping layer 506 can prevent formation of the tin whiskers.

Figure 6A:
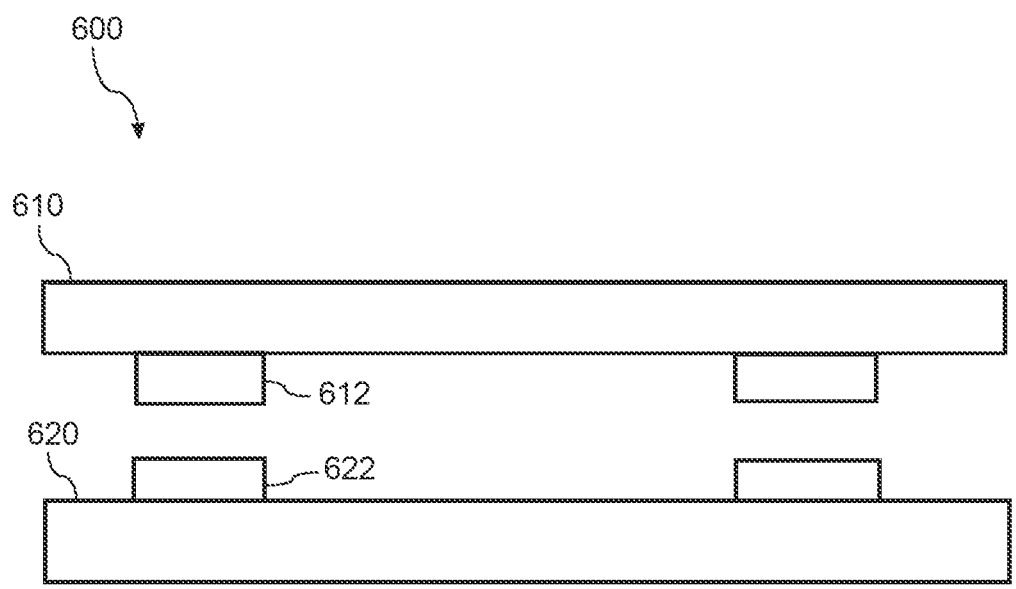
FIGS. 6A through 6D depict steps of formation of an example multilayer substrate assembly having greater than two bonded layers according to example embodiments of the present disclosure.
Figure 6B:
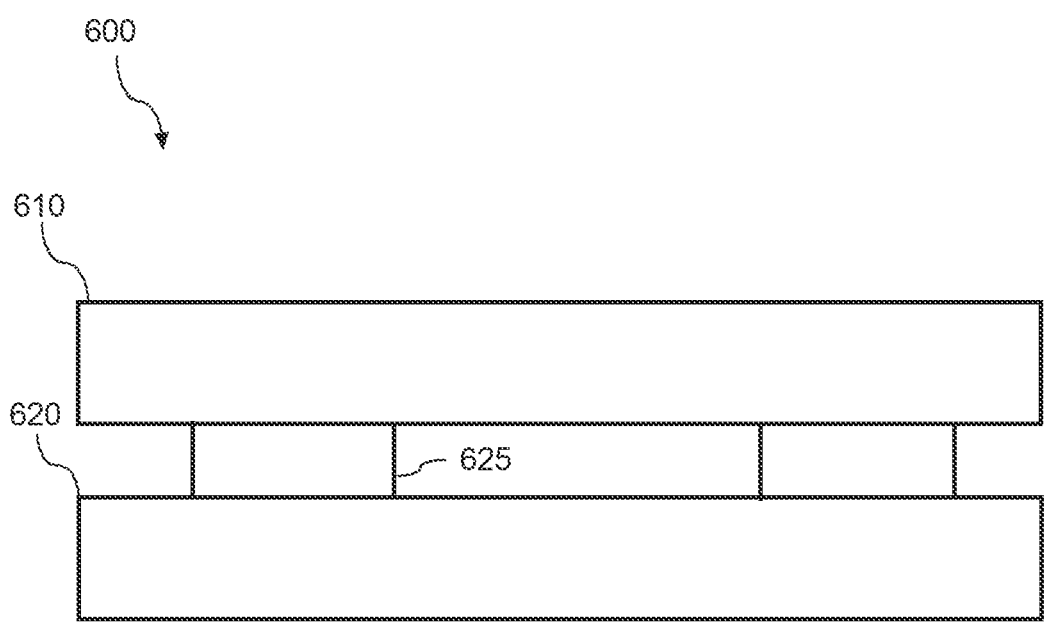

FIGS. 6A through 6D depict steps of formation of an example multilayer substrate assembly 600 having greater than two bonded layers according to example embodiments of the present disclosure. As illustrated in FIG. 6A, tin bond deposits 612 and 622 can be formed on a first substrate 610 and a second substrate 620, respectively. As described herein, the substrates 610 and/or 620 can be heated and/or mated to produce tin contact bond 625, as illustrated in FIG. 6B. The tin contact bond 625 can bond the first substrate 610 to the second substrate 620.

Figure 6C:
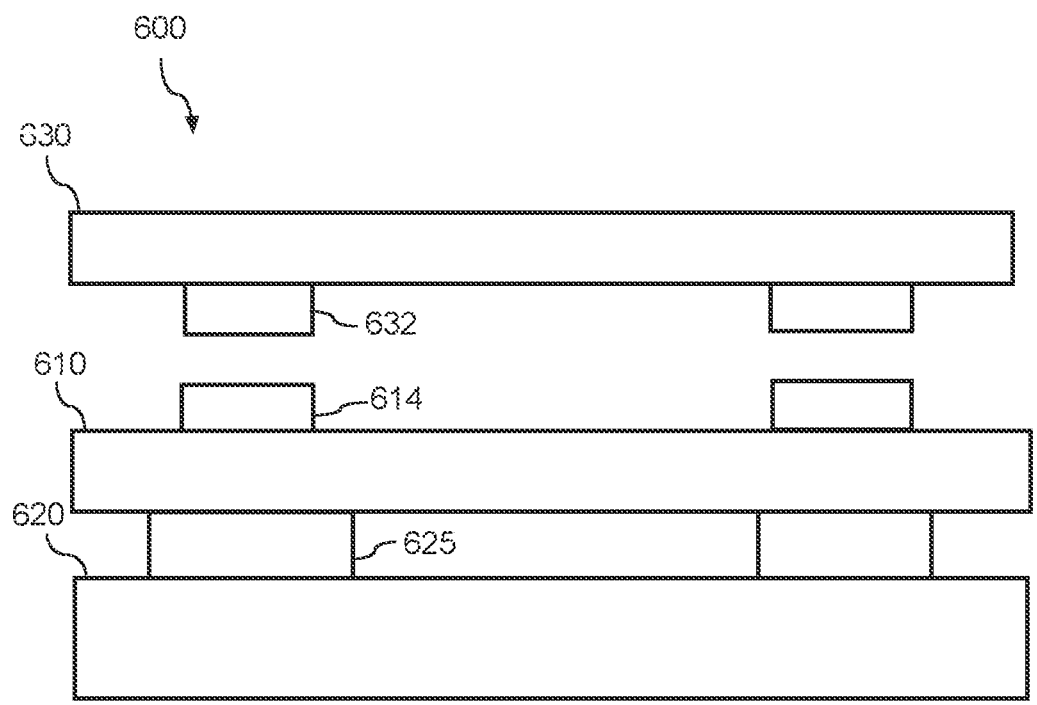
Figure 6D:
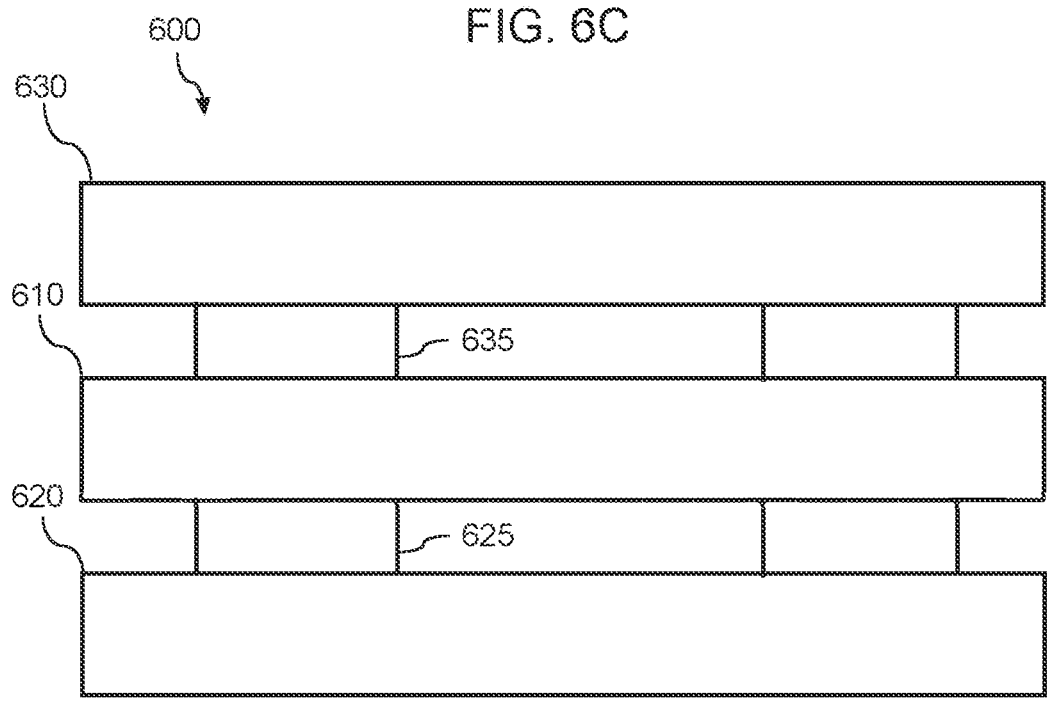

Subsequent to forming the tin contact bond 625, a third substrate 630 can be introduced. As illustrated in FIG. 6C, second bond deposits 614 can be formed on the first substrate 610. Additionally and/or alternatively, second bond deposits 632 can be formed on third substrate 630. The second bond deposits 614 and/or 632 can be or can include material that differs from that of the tin contact bonds 625 (e.g., tin bond deposits 612 and/or 622). For instance, in some embodiments, the second bond deposits 614 and/or 632 can be or can include indium. A contact bond formation temperature (e.g., a melting point) of materials used in the second bond deposits 614 and/or 632 may be lower than that of the tin and/or tin alloy used in the tin contact bonds 625. In this way, the first substrate 610 and/or the third substrate 630 can be heated to a second contact bond formation temperature and pressed together, forming second contact bonds 635 as illustrated in FIG. 6D without compromising integrity of the tin contact bonds 625 by not exceeding a melting point of the tin contact bonds 625 (e.g., of tin and/or the tin alloy used to form the tin contact bonds 625). Additionally, the tin contact bonds 625 and the second contact bonds 635 can be superconducting. By utilizing tin or a tin alloy for the tin contact bonds, multi-layer substrate assemblies can be formed. For instance, the high melting point and other beneficial qualities of tin (e.g., tin alloys) make it a desirable choice for contact bonding, especially when a capping layer is included to address tin pest, tin whiskering, oxidation, etc.

Figure 7:
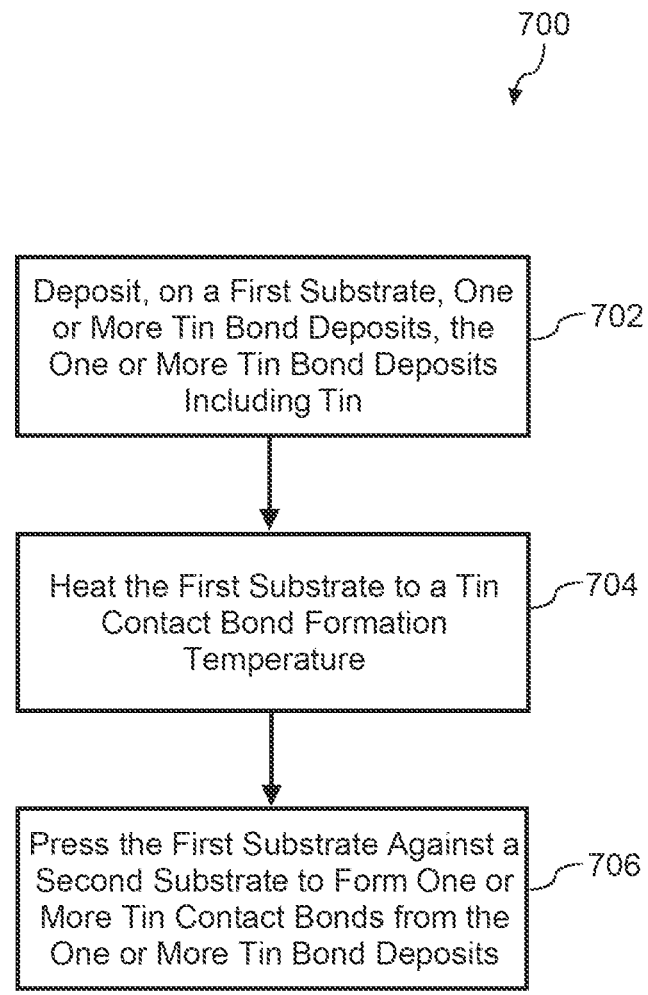
FIG. 7 depicts a flow chart diagram of an example method for bonding substrates by tin contact bonds according to example embodiments of the present disclosure.

FIG. 7 depicts a flow chart diagram of an example method 700 for bonding substrates by a tin contact bond according to example embodiments of the present disclosure. Although FIG. 7 depicts steps performed in a particular order for purposes of illustration and discussion, the methods of the present disclosure are not limited to the particularly illustrated order or arrangement. The various steps of the method 700 can be omitted, rearranged, combined, and/or adapted in various ways without deviating from the scope of the present disclosure.

The method 700 can include, at 702, depositing, on a first substrate, one or more tin bond deposits. The one or more tin bond deposits can include tin (e.g., a tin alloy). The tin bond deposits can be deposited by any suitable deposition process. For instance, in some implementations, the tin bond deposits can be deposited by a sputtering deposition process. Tin and/or other alloy materials may be sputtered against the first substrate, which can provide for precise composition control. At least one of the first substrate or the second substrate can be or can include a silicon wafer. In some implementations, one of the first substrate or the second substrate can include one or more quantum circuit elements and another of the first substrate or the second substrate can include one or more control devices configured to control the one or more quantum circuit elements. For instance, the quantum circuit elements and/or control devices can be mounted to or otherwise attached to the substrates.

The method 700 can include, at 704, heating the first substrate to a tin contact bond formation temperature. For instance, the tin contact bond formation temperature can be about a melting point of the tin bond deposits, such as a melting point of tin and/or the tin alloy. When the substrates are heated to the tin contact bond formation temperature, the tin bond deposits can become melted or otherwise malleable such that the bond deposits can be bonded to a second substrate.

The method 700 can include, at 706, pressing the first substrate against a second substrate to form one or more tin contact bonds from the one or more tin bond deposits. For instance, the first substrate and the second substrate can be mated at the tin contact bond formation temperature to form the one or more tin contact bonds. In some implementations, the method can further include aligning the first substrate and the second substrate. For instance, contact points (e.g., bond deposits) may be aligned to make precise contact when the substrates are mated.

In some implementations, prior to pressing the first substrate against the second substrate, the method can include depositing, on the second substrate, one or more second tin bond deposits. The one or more second tin bond deposits can include tin (e.g., a tin alloy). The one or more tin contact bonds are formed from the one or more second tin bond deposits. The second tin bond deposits can be identical to the tin bond deposits on the first substrate. When the first substrate and second substrate are mated, the second substrate (e.g., the second tin bond deposits) can additionally be heated to the tin contact bond formation temperature.

The one or more tin contact bonds can include one or more bump bonds between the first substrate and the second substrate. The bump bonds can be formed, for example, on interconnect pads on the first and/or second substrate. The bump bonds can be configured to transmit signals (e.g., control signals, etc.) between the first and second substrates. The bump bonds can additionally be used to couple grounds. Additionally and/or alternatively, the one or more tin contact bonds can include one or more hermetic seals. The hermetic seals can hermetically seal portions of the substrates (e.g., one or more areas or volumes between the substrates) when bonded. For example, hermetic seals can be formed to hermetically seal electrically interconnected regions to prevent damage to the electrical interconnects (e.g., bump bonds) from oxidation, impurities, or other contamination, which may degrade performance of the bump bonds. Superconducting materials (e.g., metals and/or alloys) may be used to form the hermetic seals such that the hermetic seals are electrically lossless. Similarly to the bump bonds, hermetic seals may be formed by bond deposits and when heated and pressed together.

In some implementations, the method can further include coating the one or more tin bond deposits with a capping layer. The capping layer can be formed of any suitable material, such as, for example, titanium nitride. The capping layer can be broken when the first substrate is pressed against the second substrate to form the one or more tin contact bonds. The broken portion of the capping layer may facilitate electrical transfer throughout the contact bonds. The remaining, unbroken portion of the capping layer can seal the tin contact bonds from negative factors such as tin pest, tin whiskers, oxidation, or other negative factors. The capping layer can be beneficial in using tin for a contact bond according to example aspects of the present disclosure.

According to example aspects of the present disclosure, the method can further include performing one or more subsequent process steps subsequent to pressing the first substrate against the second substrate to form the one or more tin contact bonds from the one or more tin bond deposits. The one or more subsequent process steps can include heating at least one of the first substrate or the second substrate to a temperature less than a melting point of the one or more tin contact bonds. For instance, the one or more subsequent process steps can include attaching additional components to the substrates, which may include heating the substrate. Using tin contact bonds can allow the substrates to be heated hot enough during the subsequent processing steps for steps such as, for example, attaching quantum circuit elements or other circuits, forming vias, adding new substrates, or other suitable subsequent processing steps without exceeding the melting point of the contact bonds, thus preventing degradation of the contact bonds.

Figure 8:
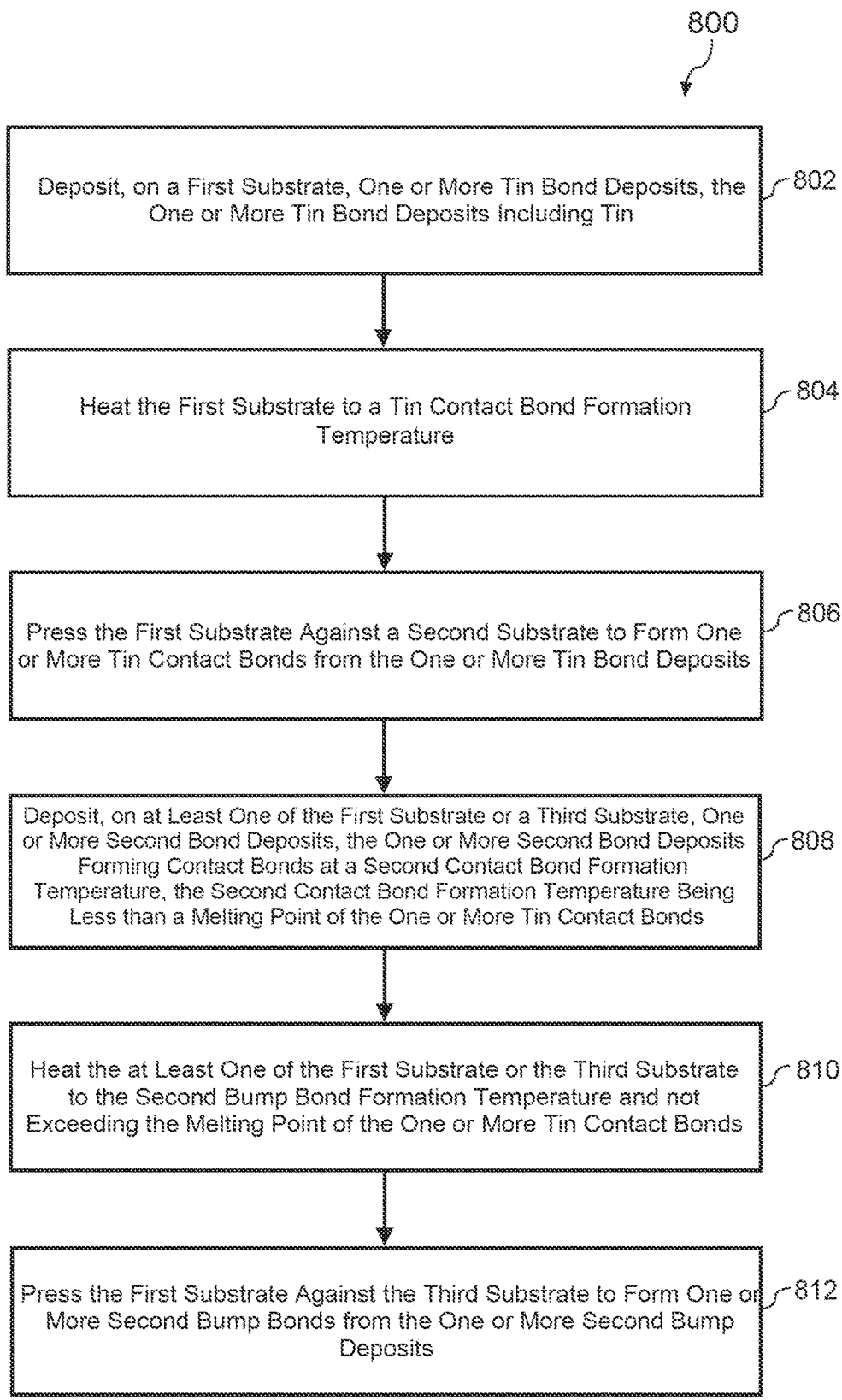
FIG. 8 depicts a flow chart diagram of an example method for bonding substrates by tin contact bonds according to example embodiments of the present disclosure.

FIG. 8 depicts a flow chart diagram of an example method 800 for bonding substrates by a tin contact bond according to example embodiments of the present disclosure. Although FIG. 8 depicts steps performed in a particular order for purposes of illustration and discussion, the methods of the present disclosure are not limited to the particularly illustrated order or arrangement. The various steps of the method 800 can be omitted, rearranged, combined, and/or adapted in various ways without deviating from the scope of the present disclosure.

The method 800 can include, at 802, depositing, on a first substrate, one or more tin bond deposits. The one or more tin bond deposits can include tin (e.g., a tin alloy). The tin bond deposits can be deposited by any suitable deposition process. For instance, in some implementations, the tin bond deposits can be deposited by a sputtering deposition process. Tin and/or other alloy materials may be sputtered against the first substrate, which can provide for precise composition control. At least one of the first substrate or the second substrate can be or can include a silicon wafer. In some implementations, one of the first substrate or the second substrate can include one or more quantum circuit elements and another of the first substrate or the second substrate can include one or more control devices configured to control the one or more quantum circuit elements. For instance, the quantum circuit elements and/or control devices can be mounted to or otherwise attached to the substrates.

The method 800 can include, at 804, heating the first substrate to a tin contact bond formation temperature. For instance, the tin contact bond formation temperature can be about a melting point of the tin bond deposits, such as a melting point of tin and/or the tin alloy. When the substrates are heated to the tin contact bond formation temperature, the tin bond deposits can become melted or otherwise malleable such that the bond deposits can be bonded to a second substrate.

The method 800 can include, at 806, pressing the first substrate against a second substrate to form one or more tin contact bonds from the one or more tin bond deposits. For instance, the first substrate and the second substrate can be mated at the tin contact bond formation temperature to form the one or more tin contact bonds. In some implementations, the method can further include aligning the first substrate and the second substrate. For instance, contact points (e.g., bond deposits) may be aligned to make precise contact when the substrates are mated.

In some implementations, prior to pressing the first substrate against the second substrate, the method can include depositing, on the second substrate, one or more second tin bond deposits. The one or more second tin bond deposits can include tin (e.g., a tin alloy). The one or more tin contact bonds are formed from the one or more second tin bond deposits. The second tin bond deposits can be identical to the tin bond deposits on the first substrate. When the first substrate and second substrate are mated, the second substrate (e.g., the second tin bond deposits) can additionally be heated to the tin contact bond formation temperature.

The one or more tin contact bonds can include one or more bump bonds between the first substrate and the second substrate. The bump bonds can be formed, for example, on interconnect pads on the first and/or second substrate. The bump bonds can be configured to transmit signals (e.g., control signals, etc.) between the first and second substrates. The bump bonds can additionally be used to couple grounds. Additionally and/or alternatively, the one or more tin contact bonds can include one or more hermetic seals. The hermetic seals can hermetically seal portions of the substrates (e.g., one or more areas or volumes between the substrates) when bonded. For example, hermetic seals can be formed to hermetically seal electrically interconnected regions to prevent damage to the electrical interconnects (e.g., bump bonds) from oxidation, impurities, or other contamination, which may degrade performance of the bump bonds. Superconducting materials (e.g., metals and/or alloys) may be used to form the hermetic seals such that the hermetic seals are electrically lossless. Similarly to the bump bonds, hermetic seals may be formed by bond deposits and when heated and pressed together.

In some implementations, the method can further include coating the one or more tin bond deposits with a capping layer. The capping layer can be formed of any suitable material, such as, for example, titanium nitride. The capping layer can be broken when the first substrate is pressed against the second substrate to form the one or more tin contact bonds. The broken portion of the capping layer may facilitate electrical transfer throughout the contact bonds. The remaining, unbroken portion of the capping layer can seal the tin contact bonds from negative factors such as tin pest, tin whiskers, oxidation, or other negative factors. The capping layer can be beneficial in using tin for a contact bond according to example aspects of the present disclosure.

The method 800 can include, at 808 depositing, on at least one of the first substrate or a third substrate, one or more second bond deposits. The one or more second bond deposits can be formed of a different material than the tin contact bonds, such as indium. The one or more second bond deposits can form contact bonds at a second contact bond formation temperature. The second contact bond formation temperature can be less than a melting point of the one or more tin contact bonds. For instance, contact bonds can be formed of the second bond deposits without degrading the tin contact bonds due to the second contact bond formation temperature being less than the melting point of the one or more tin contact bonds. In some cases, depositing the one or more second bond deposits can include depositing the one or more second bond deposits by an evaporative deposition process. In some cases, the tin contact bonds may be deposited by a sputtering deposition process, as evaporation may not be possible for e.g. alloys.

The method 800 can include, at 810, heating the at least one of the first substrate or the third substrate to the second contact bond formation temperature and not exceeding a melting point of the tin contact bonds. For instance, by not exceeding a melting point of the tin contact bonds, the tin contact bonds remain intact.

The method 800 can include, at 812, pressing the first substrate against the third substrate to form one or more second contact bonds from the one or more second bond deposits. In some implementations, the method can include, prior to pressing the first substrate against the third substrate, depositing, on the third substrate, one or more additional second bond deposits. The one or more second contact bonds can be formed from the one or more additional second tin bond deposits. In some implementations, the method can further include aligning the first substrate and the third substrate. For instance, contact points (e.g., bond deposits) may be aligned to make precise contact when the substrates are mated.

In this manner, a hybrid bond structure can be created that includes tin contact bonds between some substrates and non-tin contact bonds (e.g., indium contact bonds, aluminum contact bonds, etc.) between some other substrates. In some cases, such as for quantum computing systems, the tin contact bonds and the non-tin contact bonds can be superconducting. The tin contact bonds can provide improved fabrication process tolerance (e.g., higher processing temperature limits) at the substrates including tin contact bonds. The non-tin contact bonds may be used in areas or for process steps after which the fabrication process can be performed with a lower processing temperature but which may still require superconducting contact bonds or other bonding characteristics. In at least this manner, the tin contact bonds can provide improved fabrication process tolerance.

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for bonding substrates, the method comprising:
   depositing, on a first substrate, one or more tin bond deposits, the one or more tin bond deposits comprising tin;
   heating the first substrate to a tin contact bond formation temperature; and
   pressing the first substrate against a second substrate to form one or more tin contact bonds from the one or more tin bond deposits;
   wherein one of the first substrate or the second substrate comprises one or more qubits and another of the first substrate or the second substrate comprises one or more control devices configured to control the one or more qubits.

2. The method of claim 1 further comprising, prior to pressing the first substrate against the second substrate, depositing, on the second substrate, one or more second tin bond deposits, the one or more second tin bond deposits comprising tin, wherein the one or more tin contact bonds are formed from the one or more second tin bond deposits.

3. The method of claim 1, further comprising coating the one or more tin bond deposits with a capping layer, wherein the capping layer is broken when the first substrate is pressed against the second substrate to form the one or more tin contact bonds.

4. The method of claim 1, wherein the one or more tin bond deposits comprise a superconducting tin alloy, the superconducting tin alloy comprising at least one of lead, bismuth, antimony, gold, niobium, copper, cadmium, silver, indium, or gallium, the superconducting tin alloy superconducting at temperatures less than about 1 kelvin.

5. The method of claim 1, wherein depositing the one or more tin bond deposits comprises depositing the one or more tin bond deposits by a sputtering deposition process.

6. The method of claim 1, further comprising performing one or more subsequent process steps subsequent to pressing the first substrate against the second substrate to form the one or more tin contact bonds from the one or more tin bond deposits, the one or more subsequent process steps comprising heating at least one of the first substrate or the second substrate to a temperature less than a melting point of the one or more tin contact bonds.

7. A method of bonding substrates, the method comprising:
depositing, on a first substrate, one or more tin bond deposits, the one or more tin bond deposits comprising tin;
heating the first substrate to a tin contact bond formation temperature;
pressing the first substrate against a second substrate to form one or more tin contact bonds from the one or more tin bond deposits;
depositing, on at least one of the first substrate or a third substrate, one or more second bond deposits, the one or more second bond deposits forming contact bonds at a second contact bond formation temperature, the second contact bond formation temperature being less than a melting point of the one or more tin contact bonds;
heating the at least one of the first substrate or the third substrate to the second contact bond formation temperature and not exceeding the melting point of the one or more tin contact bonds; and
pressing the first substrate against the third substrate to form one or more second contact bonds from the one or more second bond deposits.

8. The method of claim 7, further comprising, prior to pressing the first substrate against the third substrate, depositing, on the third substrate, one or more additional second bond deposits, wherein the one or more second contact bonds are formed from the one or more additional second bond deposits.

9. The method of claim 7, wherein the one or more second bond deposits comprise indium.

10. The method of claim 7, further comprising aligning the first substrate and the third substrate.

11. The method of claim 7, wherein depositing the one or more second bond deposits comprises depositing the one or more second bond deposits by an evaporative deposition process.

12. A method for bonding substrates, the method comprising:
depositing, on a first substrate, one or more tin bond deposits, the one or more tin bond deposits comprising tin;
heating the first substrate to a tin contact bond formation temperature; and
pressing the first substrate against a second substrate to form one or more tin contact bonds from the one or more tin bond deposits; and further comprising:
coating the one or more tin bond deposits with a capping layer, wherein the capping layer is broken when the first substrate is pressed against the second substrate to form the one or more tin contact bonds.

13. The method of claim 12 further comprising, prior to pressing the first substrate against the second substrate, depositing, on the second substrate, one or more second tin bond deposits, the one or more second tin bond deposits comprising tin, wherein the one or more tin contact bonds are formed from the one or more second tin bond deposits.

14. The method of claim 12, wherein the one or more tin bond deposits comprise a superconducting tin alloy, the superconducting tin alloy comprising at least one of lead, bismuth, antimony, gold, niobium, copper, cadmium, silver, indium, or gallium, the superconducting tin alloy superconducting at temperatures less than about 1 kelvin.

15. The method of claim 12, wherein depositing the one or more tin bond deposits comprises depositing the one or more tin bond deposits by a sputtering deposition process.

16. The method of claim 12, further comprising performing one or more subsequent process steps subsequent to pressing the first substrate against the second substrate to form the one or more tin contact bonds from the one or more tin bond deposits, the one or more subsequent process steps comprising heating at least one of the first substrate or the second substrate to a temperature less than a melting point of the one or more tin contact bonds.

* * * * *